US008767446B2

(12) United States Patent
Hu et al.

(10) Patent No.: US 8,767,446 B2
(45) Date of Patent: Jul. 1, 2014

(54) MULTI-BIT SPIN-MOMENTUM-TRANSFER MAGNETORESISTENCE RANDOM ACCESS MEMORY WITH SINGLE MAGNETIC-TUNNEL-JUNCTION STACK

(75) Inventors: Guohan Hu, Yorktown Heights, NY (US); Yu Lu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 229 days.

(21) Appl. No.: 13/271,796

(22) Filed: Oct. 12, 2011

(65) Prior Publication Data

US 2013/0094282 A1    Apr. 18, 2013

(51) Int. Cl.
| | |
|---|---|
| *G11C 11/16* | (2006.01) |
| *G11C 11/15* | (2006.01) |
| *H01L 43/08* | (2006.01) |
| *H01L 27/22* | (2006.01) |
| *B82Y 10/00* | (2011.01) |

(52) U.S. Cl.
CPC ............... *G11C 11/16* (2013.01); *G11C 11/15* (2013.01); *H01L 43/08* (2013.01); *H01L 27/228* (2013.01); *B82Y 10/00* (2013.01)
USPC ........................................................ 365/158

(58) Field of Classification Search
CPC ........ G11C 11/16; G11C 11/15; H01L 43/08; H01L 27/228; B82Y 10/00
USPC ....................................................... 365/158
See application file for complete search history.

(56) References Cited

U.S. PATENT DOCUMENTS

| | | | |
|---|---|---|---|
| 6,697,294 B1 | 2/2004 | Qi et al. | |
| 6,757,189 B2 * | 6/2004 | Hung et al. ................. | 365/158 |
| 6,985,385 B2 | 1/2006 | Nguyen et al. | |
| 7,541,804 B2 | 6/2009 | Chung et al. | |
| 7,800,941 B2 | 9/2010 | Kim et al. | |
| 2010/0078763 A1 | 4/2010 | Hosotani et al. | |
| 2010/0259976 A1 | 10/2010 | Abedifard | |
| 2010/0315864 A1 | 12/2010 | Ueda et al. | |
| 2011/0103143 A1 | 5/2011 | Ranjan et al. | |

OTHER PUBLICATIONS

Ishigaki et al., "A multi-level-cell spin-transfer torque memory with series-stacked magnetotunnel junctions," VLSI Technology (VLSIT), 2010 Symposium on , vol., No., pp. 47-48, Jun. 15-17, 2010.
International Search Report and Written Opinion for International Application No. PCT/US12/54362 filed Sep. 10, 2012.

\* cited by examiner

*Primary Examiner* — Jason Lappas
(74) *Attorney, Agent, or Firm* — Cantor Colburn LLP; Vazken Alexanian

(57) ABSTRACT

A magneto resistive random access memory system includes a first magnetic-tunnel-junction device coupled to a first bit-line, a second magnetic-tunnel-junction device coupled to a second bit-line, a selection transistor coupled to the first and second bit-lines and a word-line coupled to the selection transistor.

15 Claims, 6 Drawing Sheets

MULTI-BIT SPIN-MOMENTUM-TRANSFER MAGNETORESISTENCE RANDOM ACCESS MEMORY WITH SINGLE MAGNETIC-TUNNEL-JUNCTION STACK

BACKGROUND

The present invention relates to solid state memory devices, and more specifically, to multi-bit spin-momentum transfer magnetoresistive random access memory devices that include a single magnetic-tunnel-junction stack.

An attribute of solid state memory technology is the size or area occupied by each bit of a given solid state device (e.g., a transistor), which is closely tied to cost per bit. A goal of solid state memory technology is to store more than one bit of information per memory cell, effectively multiplying the density with little additional cost. Spin-momentum-transfer (SMT) magnetoresistive random access memory (MRAM) is a non-volatile solid state memory device that uses the direction of magnetic moment in the free layer to store digital information, and use the SMT effect to change the magnetic moment direction and write digital data. The magnetic element at the center of this type of MRAM cell is the magnetic-tunnel-junction (MTJ). An MTJ has two ferromagnetic elements separated by an ultra-thin insulator. Conventionally, multi-bit cell designs for SMT-MRAM devices rely on stacking two or more different MTJ devices vertically. These vertically stacked MTJ devices must have carefully tuned properties so that the total resistance of the two MTJ in series results in four well-separated levels, and that the threshold for writing each one of the devices are well separated as well. Since both the resistance and the write threshold for MTJ are related to the area of tunnel barrier, the sidewall profile of the stacked MTJ devices is a parameter that must be carefully selected. This sensitivity results in small process window, lower yield or slower performance.

SUMMARY

Exemplary embodiments include a magneto resistive random access memory system, including a first magnetic-tunnel-junction device coupled to a first bit-line, a second magnetic-tunnel-junction device coupled to a second bit-line, a selection transistor coupled to the first and second bit-lines and a word-line coupled to the selection transistor.

Additional exemplary embodiments include a spin-momentum-transfer magnetoresistive random access memory system, including a plurality of magnetic-tunnel-junction devices and a selection transistor coupled to the plurality of magnetic-tunnel-junction devices.

Further exemplary embodiments include a method for operating a spin-momentum-transfer magnetoresistive random access memory system, the method including sensing resistance values from a first magnetic-tunnel-junction device to read data from the first magnetic-tunnel-junction device, the first magnetic-tunnel-junction device having a first area and sensing resistance values from a second magnetic-tunnel-junction device to read data from the second magnetic-tunnel-junction device, the second magnetic-tunnel-junction device having a second area, wherein the first and second areas are not equal.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Exemplary embodiments include an SMT MRAM that includes MTJ devices that are electrically connected in series with a single control (selection) transistor. The MTJ devices are fabricated from the same thin film stack and are located on a common plane. The MTJ devices are fabricated to have different areas from one another. As further described herein, the area differentials result in differing resistances and write thresholds of the MTJ devices, but while retaining identical material properties since the MTJ devices are fabricated on the same material. Local tracking of the relative size of the MTJ devices can be achieved through mask design and photolithography, as compared those required by the prior art. The exemplary MTJ devices described herein therefore enhance yield and reduce cost. Furthermore, the exemplary MTJ devices described herein can be combined with conventional MTJ devices to increase the density of the overall SMT MRAM even further. Since the MTJ devices for SMT MRAM applications are generally very small in size as compared with the cell transistor, and since two bit-line conductors are required for bi-directional write currents, the addition of an extra MTJ as described herein on the same plane does not add to the cell size.

Figure 1:
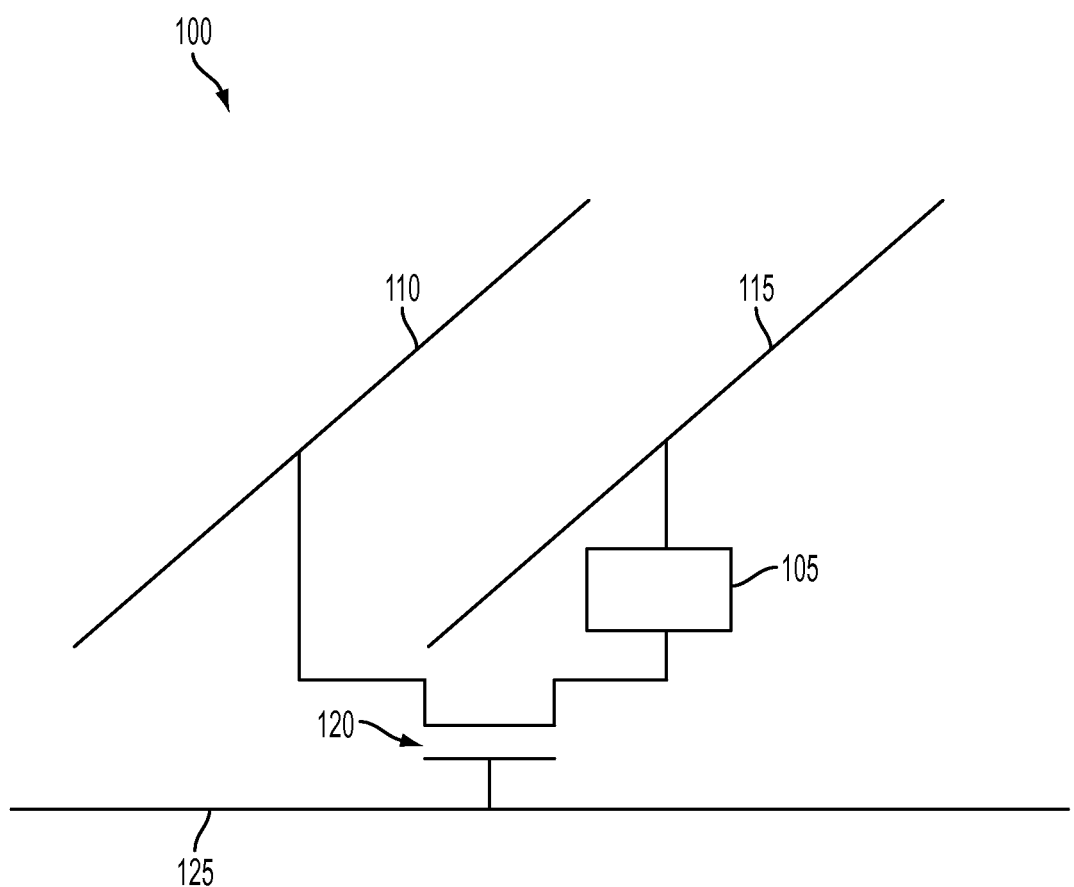
FIG. 1 schematically illustrates a portion of an MTJ memory array that can be duplicated on a common plane in accordance with exemplary embodiments.

FIG. 1 schematically illustrates a portion of an MTJ memory array 100 that can be duplicated on a common plane in accordance with exemplary embodiments. An MTJ device 105 is connected between two bit-lines 110, 115 through a selection transistor 120 (i.e., the gate of the selection transistor as further described herein). The selection transistor 120 is coupled to and controlled by a word-line 125). As known in the art, in a memory array, bit-lines represent columns of the memory array and word-lines represent rows of the memory array. Digital data is stored as magnetic states of the MTJ device 105. Elements of the MTJ device 105 are formed from two ferromagnetic plates, separated by a thin insulating layer.

One of the two plates is a permanent magnet set to a particular polarity; the magnetization direction of the other plate can be changed to encode digital information and act as one bit of memory. This configuration is known as a spin valve and is the simplest structure for a MRAM bit. The entire memory array 100 memory device is built from a grid of MTJ devices such as the MTJ device 105.

Digital data can be retrieved by sensing the resistance value of the MTJ device. The magnetic state can be influenced by passing sufficient current through the MTJ, utilizing the spin-momentum-transfer (SMT) effect. The SMT effect describes the transfer of spin angular momentum between a spin-polarized current and a ferromagnet. The transfer of angular momentum from the spin current to the ferromagnet exerts a torque on the magnetization of the ferromagnet. The SMT torque can be used to reverse the direction of the magnetization or to induce microwave oscillation of the magnetization of a ferromagnet. SMT can thus be applied to change magnetization direction of the free layer of the MTJ device 105.

The MTJ device 105 can be selected by powering the selection transistor 120, which switches current from a supply line through the cell to ground. Due to the magnetic tunnel effect, the electrical resistance of the MTJ device 105 changes due to the orientation of the fields in the two plates. By measuring the resulting current, the resistance of the MTJ device 105 can be determined. Arbitrarily but by convention, if the two plates have the same polarity the state of the MTJ device 105 is "0", while if the two plates are of opposite polarity the resistance is higher and the state of the MTJ device 105 is "1".

Data can be written to the MTJ device 105 by passing current through the bit-lines 110, 115, thereby inducing a current in the area defined between the bit-lines 110, 115. The MTJ device 105 then picks up the magnetic torque in the plates internal to the MTJ device 105.

Figure 2A:
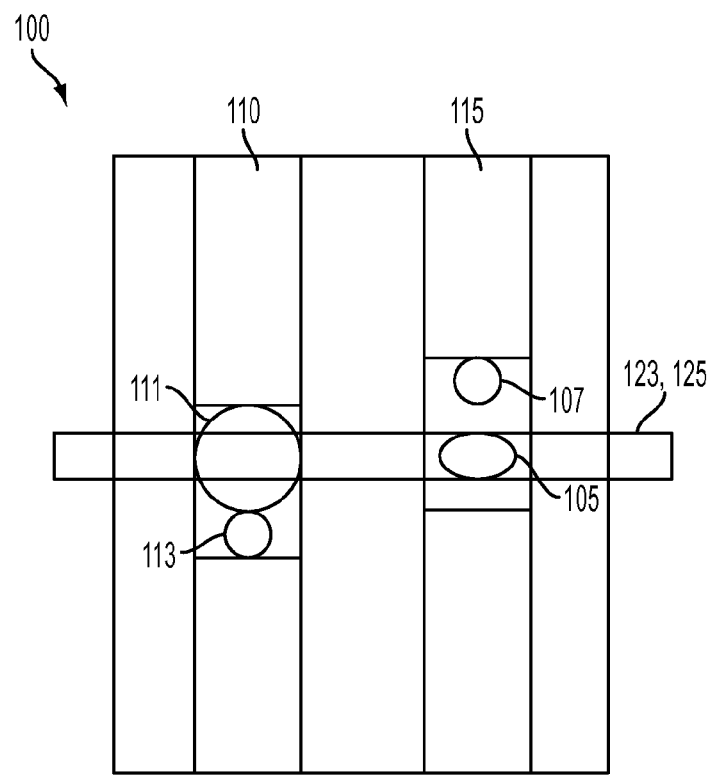
FIG. 2A illustrates a top down layout view of the portion of the MTJ memory array of FIG. 1.
Figure 2B:
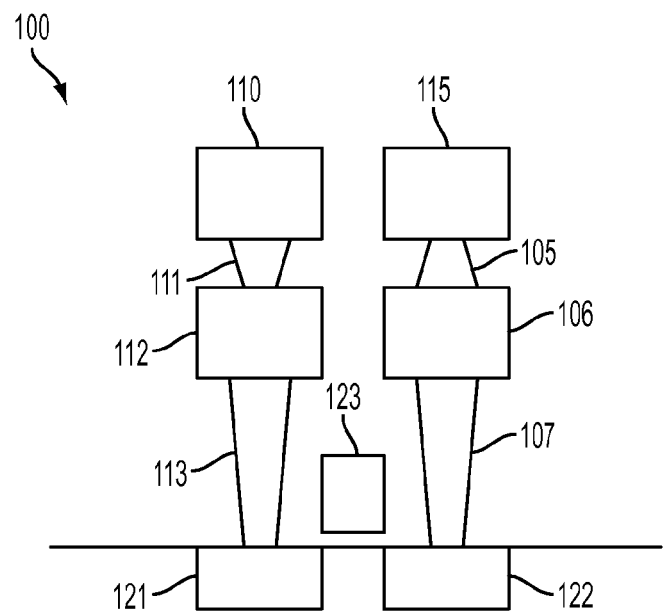
FIG. 2B illustrates a cross sectional view of the portion of the MTJ memory array of FIG. 1.

FIG. 2A illustrates an exemplary top down layout view and FIG. 2B illustrates an exemplary cross sectional view of the portion of the MTJ memory array 100 of FIG. 1, illustrating further details of the MTJ memory array 100. The selection transistor 120 further includes a source 121, drain 122 and gate 123. It can be appreciated that the gate 123 corresponds to the word-line 125. The bit-line 110 further includes a metal via 111 and a metal wire 112. The bit-line 115 including the MTJ device 105 also includes a metal wire 106. The metal wires 106, 112 are each respectively coupled to contacts 107, 113, which are in turn respectively coupled to the drain 122 and the source 121.

Figure 3:
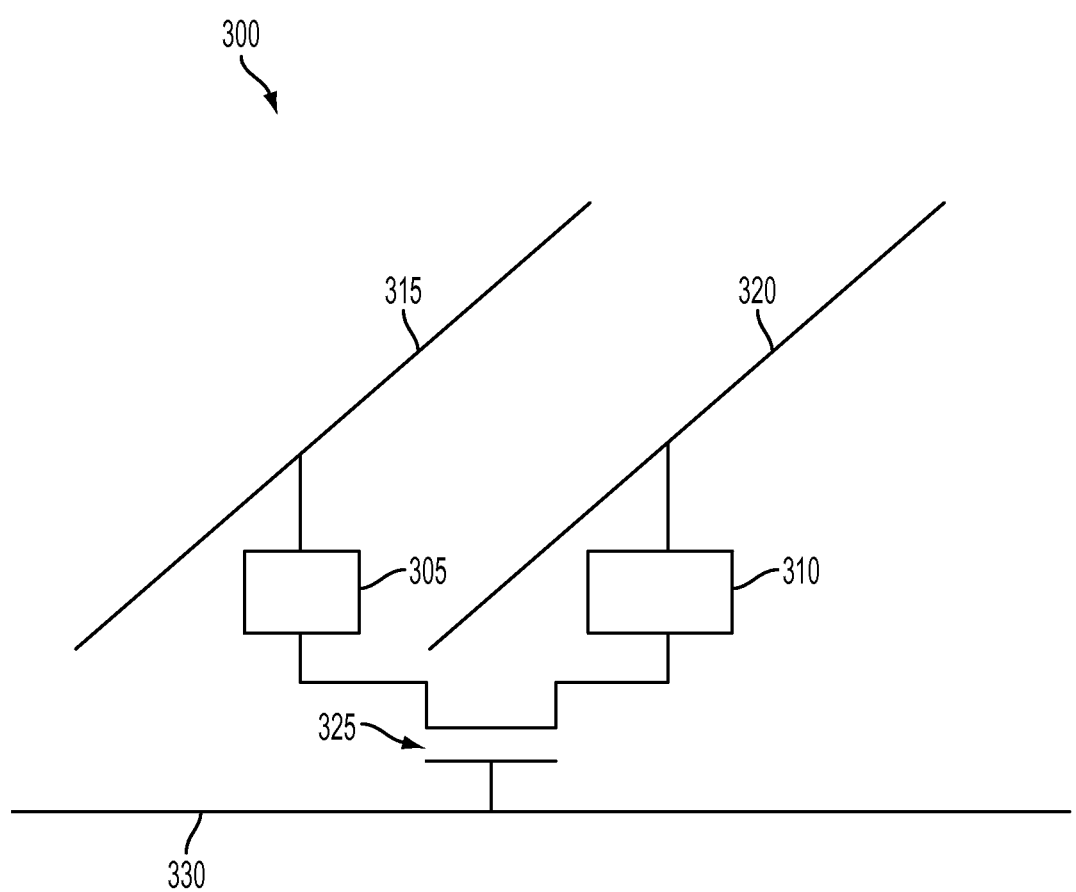
FIG. 3 schematically illustrates a portion of an exemplary MTJ memory array.

In exemplary embodiments, the MTJ memory array 100 of FIGS. 1 and 2A-2B is modified to include a second MTJ device as described herein. FIG. 3 illustrates an exemplary MTJ memory array 300 having MTJ devices on both sides of a selection transistor as now described. A first MTJ device 305 is coupled to a first bit-line 315 and a second MTJ device 310 is coupled to a second bit-line 320. The first and second MTJ devices 305, 310 are each coupled to a selection transistor 325. As described herein, the selection transistor 325 is controlled by a word-line 330 (i.e., the gate of the selection transistor 325 as further described herein). Digital data is stored as magnetic states of the first and second MTJ devices 305, 310. Similar to conventional MTJs, elements of the first and second MTJ devices 305, 310 are formed from two ferromagnetic plates, separated by a thin insulating layer. One of the two plates is a permanent magnet set to a particular polarity; the magnetization direction of the other plate can be changed to encode digital information and act as one bit of memory. This configuration is known as a spin valve and is the simplest structure for a MRAM bit. The entire memory array 300 memory device is built from a grid of MTJ devices such as the first and second MTJ devices 305, 310.

Figure 4A:
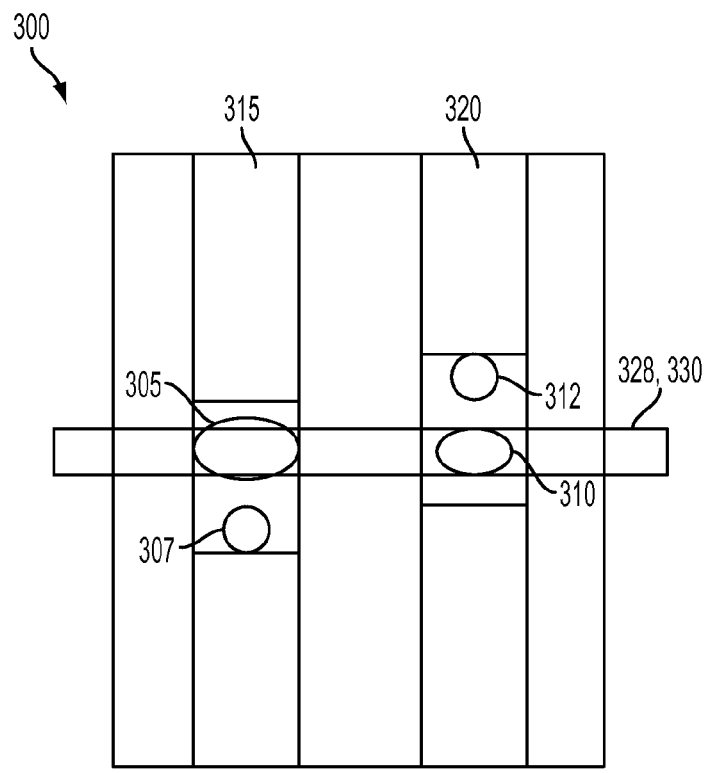
FIG. 4A illustrates a top down layout view of the portion of the MTJ memory array of FIG. 3.
Figure 4B:
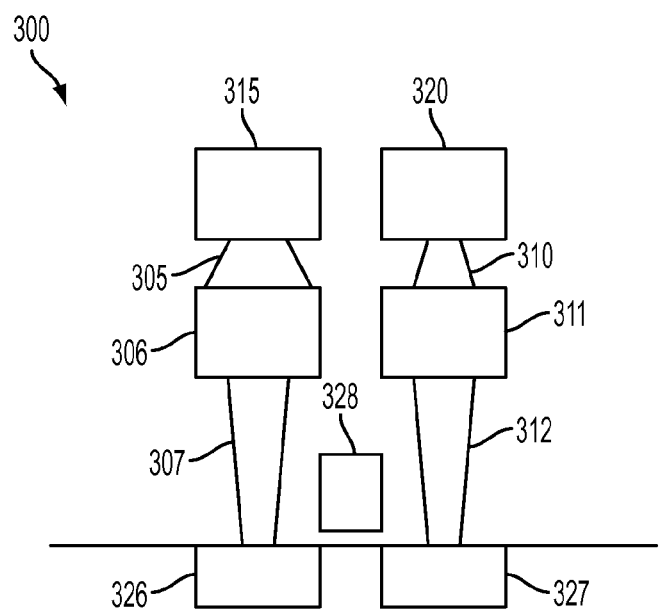
FIG. 4B illustrates a cross sectional view of the portion of the MTJ memory array of FIG. 3.

FIG. 4A illustrates a top down layout view and FIG. 4B illustrates a cross sectional view of the portion of the MTJ memory array 300 of FIG. 3, illustrating further details of the MTJ memory array 300. The selection transistor 325 further includes a source 326, drain 327 and gate 328. It can be appreciated that the gate 328 corresponds to the word-line 330. Each of the first and second bit-lines 315, 320 respectively include the MTJ devices 305, 310. Each of the first and second bit-lines 315, 320 further respectively include a metal wire 306, 311, which are each respectively coupled to a contact 307, 312. The metal contacts 307, 312 are each respectively coupled to the source 326 and drain 327.

In exemplary embodiments, a film stack from which the first and second MTJ devices 305, 310 are fabricated include material properties, including but not limited to, resistance-area product (RA), magneto-resistance (MR), and critical current density (Jc). The RA, MR, and Jc are determined by the material and processes used to form the MTJ film stack. These properties are generally independent of MTJ area. The resistance, resistance change due to magnetic states (i.e., $\Delta R$), and the current threshold for changing the magnetic state, are then related to these parameters (i.e., RA, MR, and Jc) through respective areas $AREA_1$, $AREA_2$ of the first and second MTJ devices 305, 310. As such, resistance, $R_1$, for the first MTJ device 305 is given by:

$$R_1 = RA/AREA_1$$

and resistance, $R_2$, for the second MTJ device 310 is given by:

$$R_2 = RA/AREA_2$$

Furthermore, changes to the resistance of the first and second MTJ devices 305, 310 due to magnetic states is given respectively by:

$$\Delta R_1 = MR * R_1$$

$$\Delta R_2 = MR * R_2$$

In addition, current through each of the first and second MTJ devices 305, 310 is given respectively by:

$$Ic_1 = Jc * AREA_1$$

$$Ic_2 = Jc * AREA_2$$

As such, it can be appreciated that the known intrinsic parameters RA, MR, and Jc, determined by the material and process used to form the MTJ film stack, are the same for the first and second MTJ devices 305, 310. Therefore, in exemplary embodiments, the characteristics of the first and second MTJ devices 305, 310 can be varied by adjusting the respective areas, $AREA_1$, $AREA_2$, as described herein.

In exemplary embodiments, operating margins can be modified by modifying the respective areas of the first and second MTJ devices 305, 310 in order to derive different operating parameters. For example, the operating margin can be modified by making one area of the first and second MTJ devices 305, 310 twice the area of the other of the first and second MTJ devices 305, 310:

$$AREA_1 = 2 * AREA_2$$

or $$AREA_2 = 2 * AREA_1$$

In this way, the total resistance of the first or second MTJ devices 305, 310 can have four equally separated values as now described. For example, the total resistance of the MTJ device 305 can now be given as:

$$R_1 = \frac{1}{2} * (R_2)$$

and $$\Delta R_1 = \frac{1}{2} * (\Delta R_2)$$

Furthermore:

$$Ic_1 = 2 * Ic_2$$

In this way, either read or writes can be performed on the first and second MTJ devices 305, 310. For example, the write threshold for the first and second MTJ devices is now separated by a factor of two. For example, the current required to switch the first MTJ device 305 can be 2 µA and the current required to switch the second MTJ device 310 can be 1 µA. For a conventional MTJ device, it is known that passing different currents through the bit-lines changes the MR and thus the state of the MTJ device can be determined by measuring the MR. Similarly, in exemplary embodiments, the two different value currents can be passed through the bit-lines 315, 320 to perform both reads and writes. In exemplary embodiments, the write threshold of the larger MTJ (with bigger area) is higher than that of the smaller MTJ. To write the larger MTJ, it is then necessary to read the state of the smaller MTJ device first, and restore this data after the larger MTJ had been written if necessary.

Figure 5A:
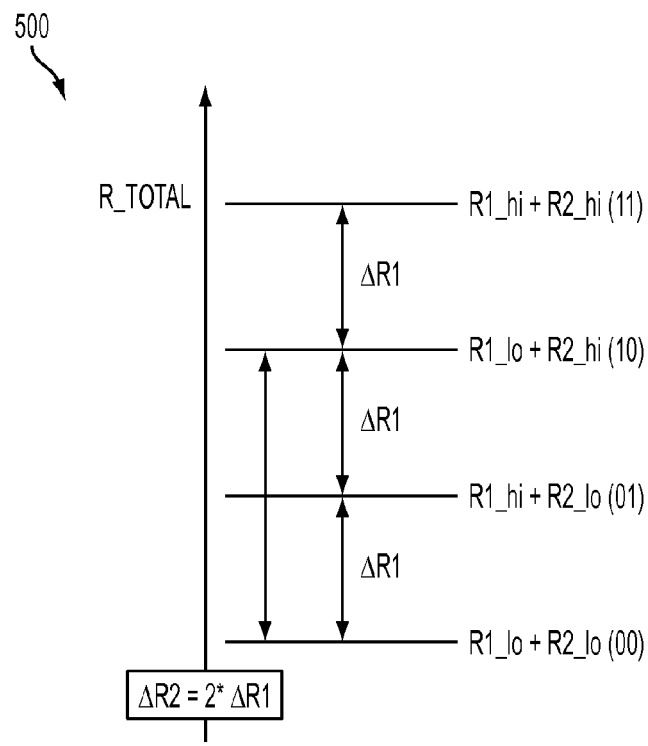
FIG. 5A illustrates a chart of resistance values.
Figure 5B:
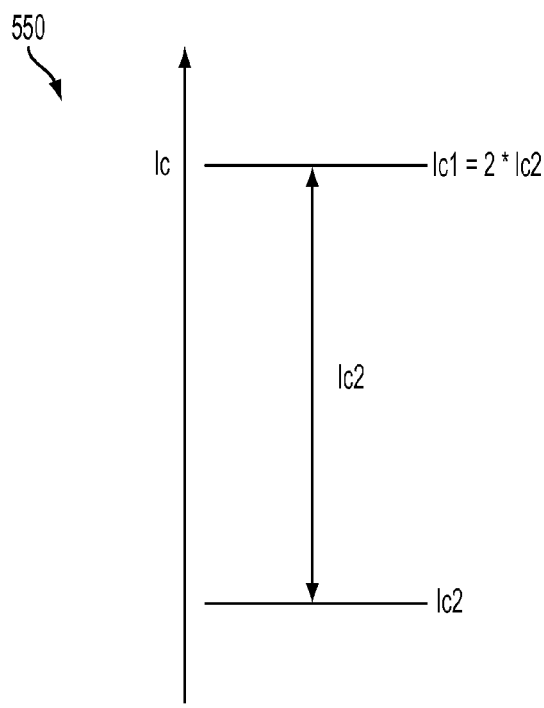
FIG. 5B illustrates a chart of current values.

FIG. 5A illustrates a chart 500 of the four distinct and equally separated resistance values that can result depending on the current applied to each of the first and second MTJ devices 305, 310. In this example, "hi" refers to the 2 µA current value and "lo" refers to the 1 µA current value. For example, "$R_1\_hi$" refers to the resistance value of the 2 µA current value applied to the first MTJ device 305, "$R_2\_lo$" refers to the resistance value of the 1 µA current value applied to the second MTJ device 310 and so on. As can further be seen in FIG. 5A, the resistance values in the example are equally separated by the value, $\Delta R_1$. FIG. 5B illustrates a chart 550 showing the relationship of the total currents $Ic_1$ and $Ic_2$ as described herein.

It can be appreciated that multiple MTJ devices can be stacked on each bit-line to further increase the density of bits on each of the bit-lines. For example, two MTJ film stacks with different material properties are deposited on top of each other AND two MTJ devices of different area are fabricated, which achieves four bits per selection transistor and thus sixteen distinct resistance values.

Figure 6:
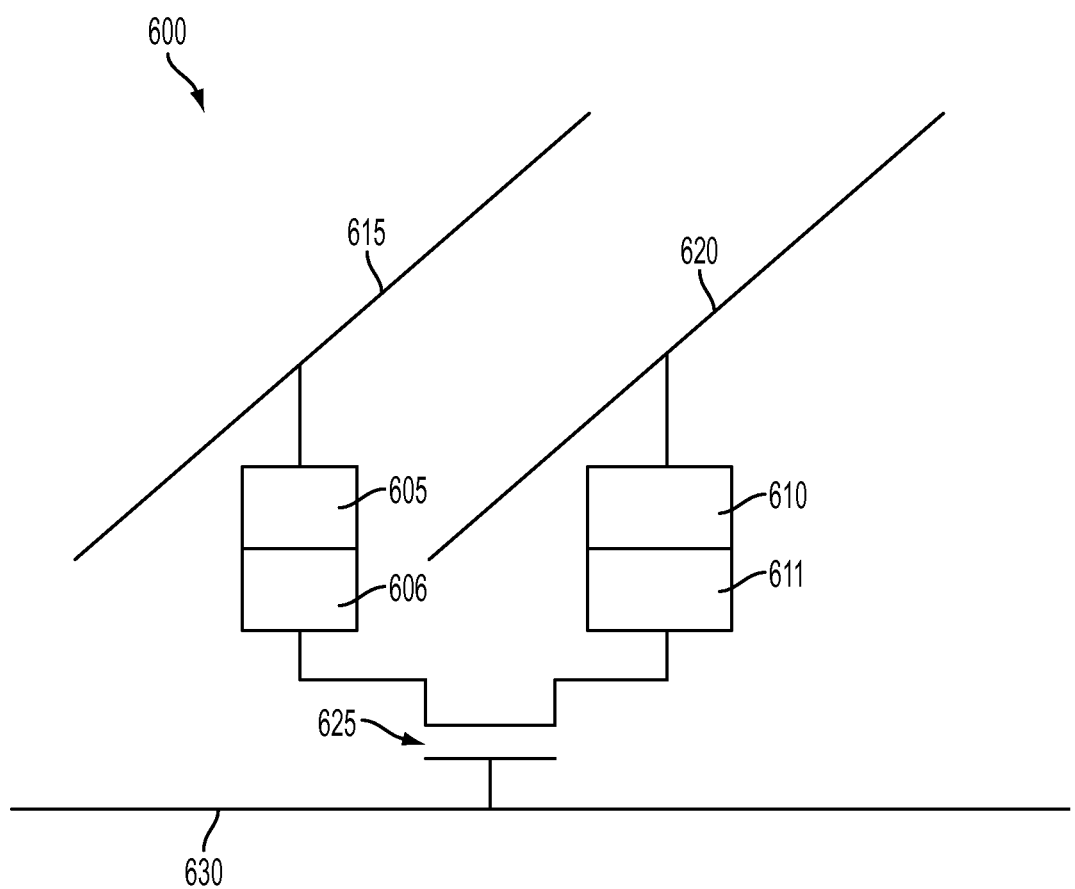
FIG. 6 schematically illustrates an exemplary MTJ memory array having multiple MTJ devices on both sides of a selection transistor.

FIG. 6 schematically illustrates an exemplary MTJ memory array 600 having two MTJ devices on both sides of a selection transistor. A first and second MTJ device 605, 606 are coupled to a first bit-line 615 and a third and fourth MTJ device 610, 611 are coupled to a second bit-line 620. The first and second MTJ devices 605, 606 and the third and fourth MTJ devices are each coupled to a selection transistor 625. As described herein, the selection transistor 325 is controlled by a word-line 630 (i.e., the gate of the selection transistor 325 as further described herein). Digital data is stored as magnetic states of the first and second and third and fourth MTJ devices 605, 606, 610, 611. The first and second and third and fourth MTJ devices 605, 606, 610, 611 include the similar properties as the other exemplary MTJ devices described herein.

It is to be understood that the above description is for illustration purposes only. It can be appreciated that further exemplary embodiments with differing number of MTJ devices and differing areas are further contemplated.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A spin-momentum-transfer magneto resistive random access memory (SMT-MRAM) system, comprising:
    a first spin-momentum-transfer magnetic-tunnel-junction (SMT-MTJ) device coupled to a first bit-line having a selectable data state set by passing a current through the first bit line;
    a second SMT-MTJ device coupled to a second bit-line having a selectable data state set by passing a current through the second bit line;
    a selection transistor coupled to the first and second SMT-MTJ devices; and
    a single word-line coupled to the selection transistor operative to enable reading the data states of the first and second SMT-MTJ devices.

2. The system as claimed in claim 1 wherein:
    the first SMT-MTJ device has a first resistance value which is affected by the data state of the first SMT-MTJ;
    the second SMT-MTJ device has a second resistance value which is affected by the data state of the second SMT-MTJ;
    the first resistance is different from the second resistance by an operating margin; and
    the single word-line is operative to enable reading the data states of the first and second SMT-MTJ devices due varying levels of current conducted through the selection transistor in response to the resistance values and data states of the first and second SMT-MTJ devices.

3. The system as claimed in claim 2 wherein the word-line is connected to a gate of the selection transistor.

4. The system as claimed in claim 3 wherein the first SMT-MTJ device is connected to a source of the selection transistor and the second SMT-MTJ device is connected to a drain of the selection transistor causing a current to flow through both SMT-MTJ devices when power is supplied to the gate of the selection transistor.

5. The system as claimed in claim 4 wherein each different combination of data states of the SMT-MTJ devices produces a different resistance value for the combined SMT-MTJ devices resulting in a different current value being conducted through the selection transistor each different combination of data states of the SMT-MTJ.

6. The system as claimed in claim 5 wherein the SMT-MTJ devices comprise different portions of a common layer of a solid state material, each SMT-MTJ device occupies a different amount of area of the solid state material, and the differing resistance values of the SMT-MTJ devices is attributable at least in part to their differing areas.

7. The system as claimed in claim 6 wherein the operating margin is attributable at least in part to the differing areas of the SMT-MTJ devices.

8. The system as claimed in claim 7 wherein the area of the first SMT-MTJ device is at least about twice the area of the second SMT-MTJ device.

9. The system as claimed in claim 8 wherein the first and second SMT-MTJ devices share a common resistance-area product (RA).

10. The system as claimed in claim 9 wherein a resistance of the first SMT-MTJ device is given by R1=RA/AREA1 and a resistance of the second SMT-MTJ device is given by R2=RA/AREA2.

11. The system as claimed in claim 10 wherein the first and second SMT-MTJ devices share a common magneto-resistance (MR).

12. The system as claimed in claim 11 wherein a resistance change due to magnetic states of the first SMT-MTJ device is given by ΔR1=MR*R1 and a change due to magnetic state of the second SMT-MTJ device is given by ΔR2=MR*R2.

13. The system as claimed in claim 8 wherein AREA1=2*AREA2.

14. The system as claimed in claim 13 wherein a write threshold for the first SMT-MTJ device and a write threshold of the second SMT-MTJ devices are separated by a factor of two.

15. The system as claimed in claim 14 wherein a total resistance of each of the first and second SMT-MTJ devices each include four distinct values.

\* \* \* \* \*